United States Patent
Ljung

(10) Patent No.: US 7,502,813 B2
(45) Date of Patent: Mar. 10, 2009

(54) SOFTWARE UPDATE PROCESS USING AN EXTRA MEMORY BLOCK

(75) Inventor: Peter Ljung, Malmö (SE)

(73) Assignee: Sony Ericsson Mobile Communications AB, Lund (SE)

( * ) Notice: Subject to any disclaimer, the term of this patent is extended or adjusted under 35 U.S.C. 154(b) by 264 days.

(21) Appl. No.: 10/598,683

(22) PCT Filed: Feb. 17, 2005

(86) PCT No.: PCT/EP2005/050701

§ 371 (c)(1),
(2), (4) Date: Sep. 8, 2006

(87) PCT Pub. No.: WO2005/085997

PCT Pub. Date: Sep. 15, 2005

(65) Prior Publication Data

US 2008/0126672 A1  May 29, 2008

(30) Foreign Application Priority Data

Mar. 10, 2004 (EP) .................................. 04005700

(51) Int. Cl.
*G06F 13/00* (2006.01)
(52) U.S. Cl. ................. 707/203; 707/204; 707/205; 711/162; 711/165; 711/103; 711/170; 713/100
(58) Field of Classification Search ............. 711/162, 711/165, 103, 170; 713/1, 2, 100; 714/6, 714/7; 707/203, 204, 205
See application file for complete search history.

(56) References Cited

U.S. PATENT DOCUMENTS

| | | | |
|---|---|---|---|
| 5,522,076 A * | 5/1996 | Dewa et al. ............... 713/2 |
| 5,708,809 A | 1/1998 | Leimkoetter | |
| 6,141,795 A | 10/2000 | Laugner | |
| 2002/0002652 A1 * | 1/2002 | Takahashi ................ 711/103 |
| 2002/0188814 A1 * | 12/2002 | Saito et al. ................ 711/159 |
| 2003/0167373 A1 | 9/2003 | Easterling et al. | |
| 2004/0015671 A1 * | 1/2004 | Kondo ....................... 711/173 |
| 2004/0040020 A1 * | 2/2004 | Yang ......................... 717/168 |
| 2004/0044869 A1 | 3/2004 | Louie et al. | |

FOREIGN PATENT DOCUMENTS

| | | | |
|---|---|---|---|
| EP | 0398545 A | 11/1990 |
| EP | 0803812 A | 10/1997 |
| EP | 1120709 A | 8/2001 |

* cited by examiner

*Primary Examiner*—Hong Kim
(74) *Attorney, Agent, or Firm*—Renner, Otto, Boisselle & Sklar, LLP

(57) ABSTRACT

Method for updating software present in a first version (V1) in a device (40), by receiving and executing a delta file (D12) for upgrading said first version to a second version (V2), which software is divided and stored in a number of memory blocks (201-204) defined in an address space (211) of a physical memory (48) in the device, comprising the steps of: defining an extra memory block (212) associated with said number of memory blocks; erasing said extra memory block to define an extra memory block space; writing updated data for a first of said number of memory blocks, as determined by said delta file, on said extra memory block; erasing said first memory block, thereby moving said extra memory block space one block; and writing updated data for a second of said number off memory blocks, as determined by said delta file, on said first memory block.

6 Claims, 5 Drawing Sheets

Fig. 1. STATE OF THE ART

SOFTWARE UPDATE PROCESS USING AN EXTRA MEMORY BLOCK

FIELD OF THE INVENTION

The present invention relates methods for used in computers and microprocessor systems for upgrading software by receiving and executing delta files for target upgrade. In particular, the invention relates to improved solutions for coping with potential power loss during target upgrade.

BACKGROUND

There are several technologies that enable upgrade of software binaries by only sending the differences between a current software version and an updated software version. The difference in a new version of a particular piece of software is typically about 1-10% of the source binaries. The procedure of using a difference file, generally denoted delta file, is especially advantageous when updates are sent over low bandwidth bearers like GPRS (General Packet Radio Service). This technology is called Firmware Upgrade Over the Air, and is currently standardized within OMA. One example of how this type of upgrade works can be outlined as follows:

A mobile phone, which is the microprocessor-controlled device to upgrade, currently has software V1. The goal is to update the software to the latest release version V2. The following procedure is performed to update the software in the mobile phone:
1. Compile and link target software, V2;
2. Compute the difference D12 of the binaries from V1 to V2. D12 contains all information needed to create V2 from V1;
3. Transport D12 to target, e.g. over GPRS;
4. Let target device re-flash, i.e. upgrade, itself by using the current binary V1 and D12 to create V2 on target.

The target device has now been updated to V2 by only sending a small update package D12 to the device.

A critical step in the update process above is target upgrade. Due to the fact that the target software, e.g. RTOS (Real Time Operating System) and applications, is being re-flashed a power loss could be fatal for the device. The update process must be 100% fault recovery safe, meaning that the update process must be able to continue after an unexpected power failure. A state of the art method used to implement fail safe capability is called 2 phase commit, which is already used in a number of applications like databases. The idea is to keep a copy of the old information during the update. Not until the update is complete the old information is removed. In this manner it is always possible to go back to the last state if the update would fall during the update.

For devices using NOR flash the memory is divided in equally sized blocks of typically 64 kB. There are special constrains when writing a NOR device. Only whole blocks can be erased at once, at which all bits in the block are set to 1. Write can be performed on byte level but it is only possible to change bit state from 1 to 0. Upgrade on a NOR device is performed block by block. To enable fail recovery each block is first copied to a specific backup block before updated block is written to the original block. This state of the art procedure is now described with reference to FIG. 1.

A particular device software consists of four software blocks 1-4, stored in four memory blocks 101-104. Memory blocks 101-104 are defined in a memory space 111 in a physical memory of the device. Memory blocks 101-104 are depicted vertically as represented in a particular state 106-110 during an update process. Each column represents a new state in the update process, running from left to right as indicated by the arrows in the drawing. The process is also associated with a delta package, state information and the update application, but these are not illustrated here for the sake of clarifying the overall process as such. During an update process two software blocks 1 and 2 have already been updated, which is the state depicted in column 106. Block 3 shall be updated next. To be able to recover from a potential power loss, information need to be stored persistently. State information is used to keep track of which block is being processed, and in which state of the update you currently are. In addition, the old block must be kept until the new block is generated. The process of updating block 3 is achieved by first erasing backup block 105, which is also defined in memory space 111, in the step to state 107. The data of block 3 is then copied from block 103 to backup block 105 in the step to state 108. Block 103 is subsequently erased in the step to state 109, leaving an empty block 103. Finally, the Write process is performed in the step to state 110 on block 103, upgrading the data therein to new block 3. Alternatively, the new block 3 is created in backup block 105, instead of copying the old block 3 to backup block 105.

Had the backup block 105 not been used, a power loss after block erase and before the new block is completely written would be unrecoverable, since neither the source block nor the destination block would be available. By using the procedure above it is always possible to take up the update where it exited by rewriting the last block and continue with the update.

A problem with this state of the art procedure is that the write time during flash update is doubled because each block has to be written twice for each block to support power loss recovery. For NOR flashes the typical write speed is about 200 kB/s. The time for writing blocks in a 16 MB image update is then roughly 16 MB*2/0.2=160 seconds, if all blocks need to be updated. During update the device is completely unusable so it is important to keep this time as low as possible. Depending on the size of the update and how code changes are distributed in the new binary image the number of blocks that have to be updated can be different. Experience reveals that the most updates need to update the majority of all available blocks. There are methods to decrease the number of blocks that need to be updated by structuring the binary image in such a way that updates are concentrated to smaller parts of the image. However, these techniques are quite complex.

SUMMARY OF THE INVENTION

It is a general object of the present invention to provide an improved solution for guaranteeing that a software update process is recoverable after an interruption, e.g. due to a power loss. In particular, it is an object to provide a solution for upgrading software binaries by the use of delta files, which minimises the target upgrade time.

According to a first aspect of the invention, this object is fulfilled by a method for updating software present in a first version in a device, by receiving and executing a delta file for upgrading said first version to a second version, which software is divided and stored in a number of memory blocks defined in an address space of a physical memory in the device, comprising the steps of:

defining an extra memory block associated with said number of memory blocks;

erasing said extra memory block to define an extra memory block space;

writing updated data for a first of said number of memory blocks, as determined by said delta file, on said extra memory block;

erasing said first memory block, thereby moving said extra memory block space one block; and writing updated data for a second of said number of memory blocks, as determined by said delta file, on said first memory block.

In a preferred embodiment, said extra memory block is defined as a memory block placed adjacent to said first memory block in said address space.

Advantageously, the method comprises the step of processing all of said number of memory blocks one by one from said extra memory block by writing data on one of said number of memory blocks from the next memory block in said address space, during upgrading as determined by said delta file, until all of said number of memory blocks have been shifted one step in the address space.

In one embodiment, the method comprises the step of reversing the order of writing memory blocks in the address space, from said upgrade from a first version to a second version, to a second upgrade from said second version to a third version.

Preferably, the method comprises the steps of:

said device, before receiving and executing a delta file, connecting with a server and communicating information related to a current address space status determining which type of delta file is applicable for upgrading said software, dependent on the present location of said extra block in said address space, wherein a first delta file type is adapted to upgrade the software present in said memory blocks in one order in the address space, and a second delta file adapted to upgrade the software present in said memory blocks in a reversed order in the address space;

downloading a delta file of the applicable delta file type from said server to said device; and upgrading said software using the applicable delta file.

In one embodiment, the method comprises the step of modifying a start address within said address space in a boot code for said software, dependent on the moving of data between said memory blocks during writing as determined by said delta file.

According to a second aspect of the invention, the stated object is solved by a computer program product, for use in a computer-controlled electronic device for updating software present in a first version in the device, which device comprises means for receiving and executing a delta file for upgrading said first version to a second version, which software is divided and stored in a number of memory blocks defined in an address space of a physical memory in the device, said computer program product comprising executable computer program code devised to cause the device to perform the steps of:

defining an extra memory block with said number of memory blocks;

erasing said extra memory block to define an extra memory block space;

writing updated data for a first of said number of memory blocks, as determined by said delta file, on said extra memory block;

erasing said first memory block, thereby moving said extra memory block space one block; and writing updated data for a second of said number of memory blocks, as determined by said delta file, on said first memory block.

In one embodiment, the computer program product comprises executable computer program code devised to cause the device to perform the steps of any of the method steps above.

According to a third aspect of the invention, the stated object is solved by a radio communication terminal comprising a computer system with associated computer code for updating software present in a first version in the terminal, and means for receiving and executing a delta file for upgrading said first version to a second version, which software is divided and stored in a number of memory blocks defined in an address space of a physical memory in the terminal, wherein an extra memory block associated with said number of memory blocks is defined in said address space, said terminal further comprising means for erasing said extra memory block for defining an extra memory block space; data writing means for writing updated data for a first of said number of memory blocks, as determined by said delta file, on said extra memory block, data erasing means for erasing said first memory block for moving said extra memory block space one block; wherein said data writing means are devised to write updated data for a second of said number of memory blocks, as determined by said delta file, on said first memory block.

In one embodiment, said extra memory block is placed adjacent to said first memory block in said address space.

Preferably, said data writing means are devised to process all of said number of memory blocks one by one from said extra memory block by writing data on one of said number of memory blocks from the next memory block in said address space, during upgrading as determined by said delta file, until all of said number of memory blocks have been shifted one step in the address space.

Advantageously, the radio communication terminal comprises means for reversing the order of writing memory blocks in the address space, from said upgrade from a first version to a second version, to a second upgrade from said second version to a third version.

In a preferred embodiment, said device is arranged to connect with a server before receiving and executing a delta file, for communicating information related to a current address space status determining which type of delta file is applicable for upgrading said software, dependent on the present location of said extra block in said address space, wherein a first delta file type is adapted to upgrade the software present in said memory blocks in one order in the address space, and a second delta file adapted to upgrade the software present in said memory blocks in a reversed order in the address space, said terminal comprising means for downloading a delta file of the applicable delta file type from said server to said device, and means for upgrading said software using the applicable delta file.

Preferably, the radio communication terminal comprises means for modifying a start address within said address space in a boot code for said software, dependent on the moving of data between said memory blocks during writing as determined by said delta file.

BRIEF DESCRIPTION OF THE DRAWINGS

The features and advantages of the present invention will be more apparent from the following description of the preferred embodiments with reference to the accompanying drawings, on which FIG. 1 schematically illustrates a prior art process for updating software by target upgrade.

DETAILED DESCRIPTION OF PREFERRED EMBODIMENTS

The present description refers to means and methods for use in firmware upgrade of software using delta files and target upgrade. The invention is particularly advantageous for use in systems with relatively low transmission bandwidth, but is not restricted to such fields. The preferred embodiment described below relates to the field of mobile telephony, and especially to the implementation in radio communication terminals. The term radio communication terminal includes all mobile communication equipment devised for radio communication with a radio station, which radio station also may be mobile terminal or e.g. a stationary base station. Consequently, the term radio terminal includes mobile telephones, communicators, electronic organisers, smartphones, PDA:s (Personal Digital Assistants), vehicle-mounted radio communication devices, or the like, as well as portable laptop computers devised for wireless communication in e.g. a WLAN (Wireless Local Area Network). Furthermore, it should be emphasised that the term comprising or comprises, when used in this description and in the appended claims to indicate included features, elements or steps, is in no way to be interpreted as excluding the presence of other features elements or steps than those expressly stated.

The following description relates to preferred embodiments of the present invention, in which an address space comprises four memory blocks. It should be noted though, that the present invention is applicable to an address space comprising any number of memory blocks.

Figure 1:
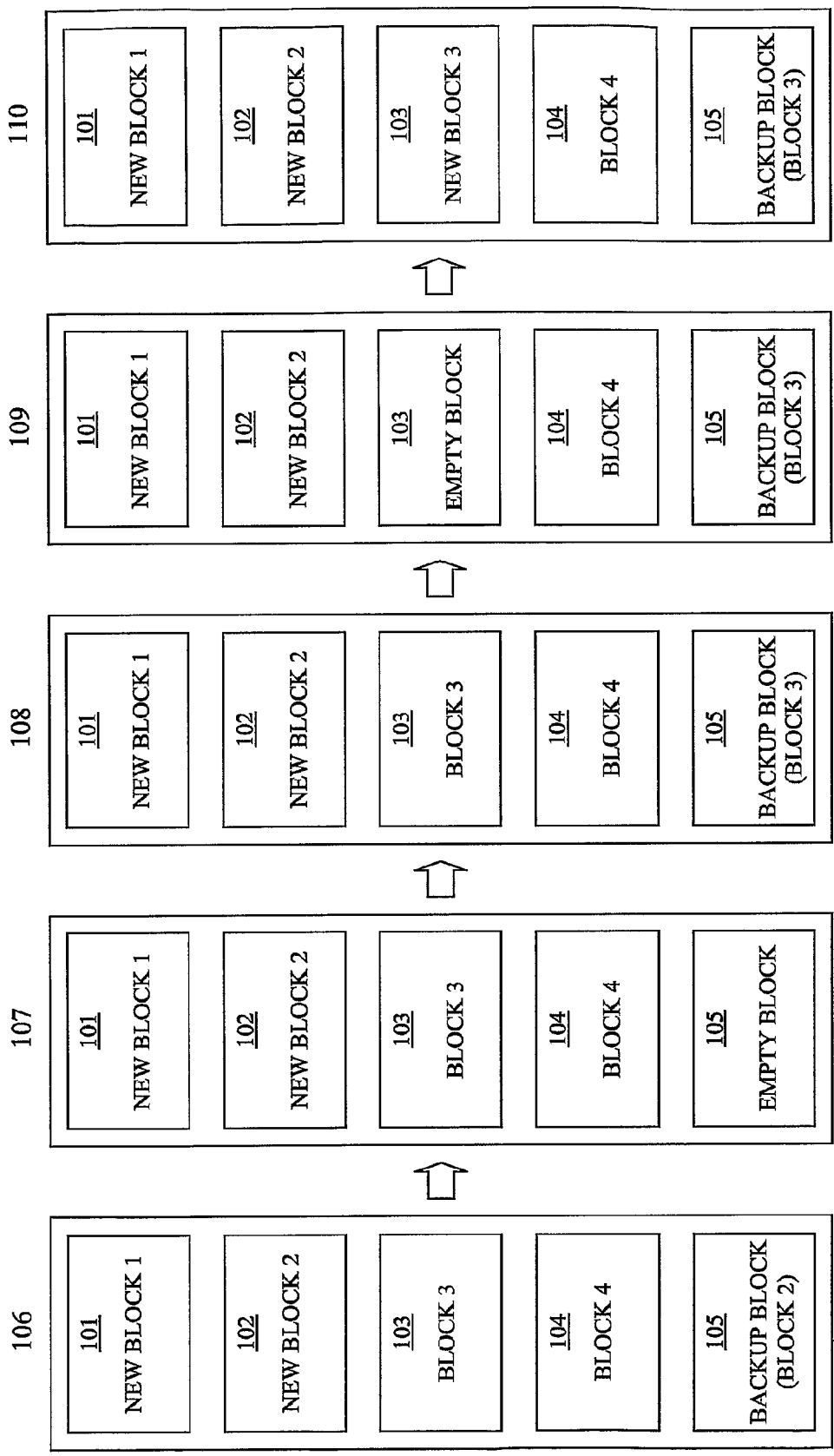
Figure 2:
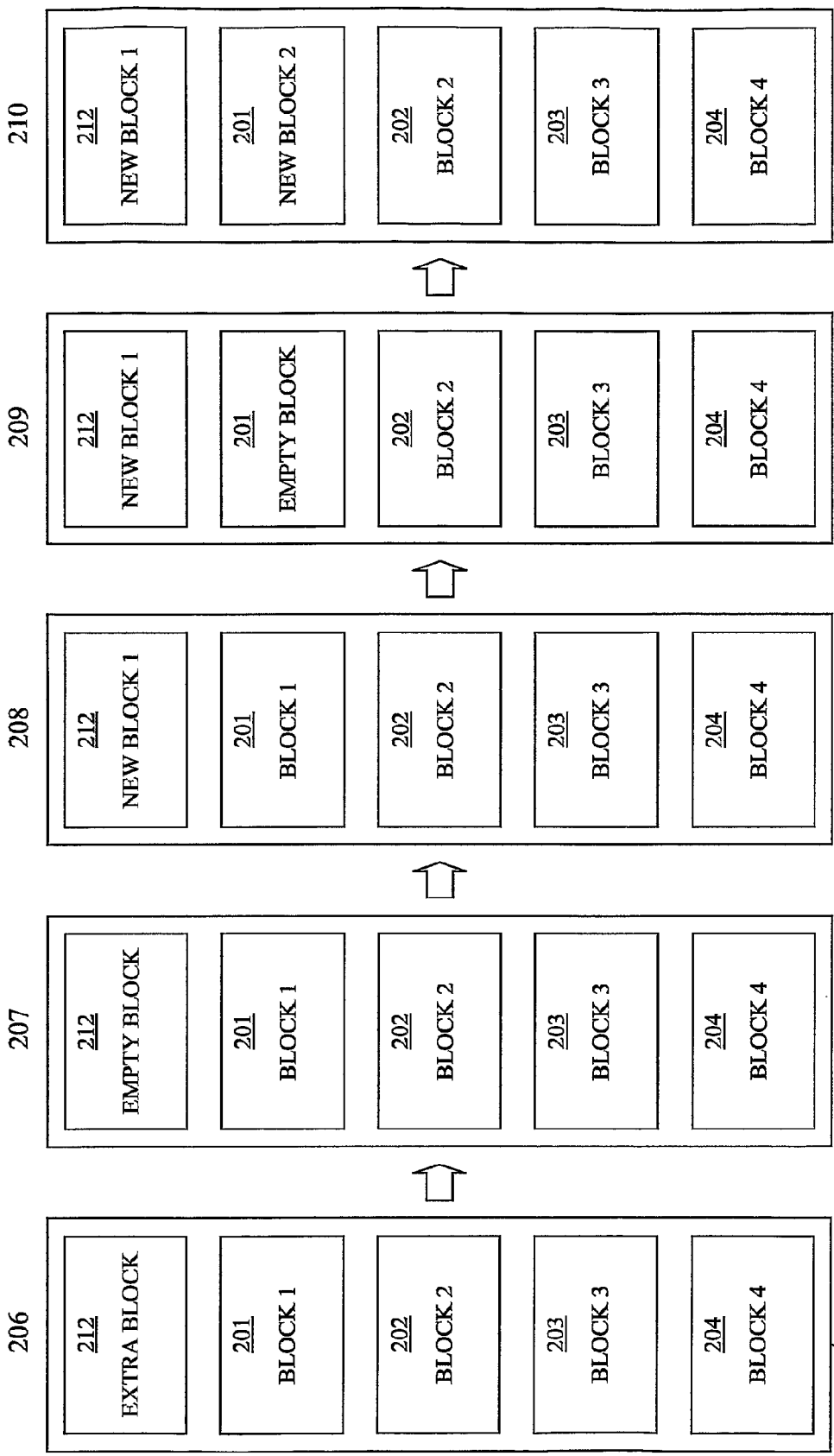
FIG. 2 schematically illustrates a process according to an embodiment of the present invention, for updating software by target upgrade.

FIG. 2 illustrates a preferred embodiment of the strategy of the present inventive method for automatic backup store in firmware upgrade. By using this update strategy the need to backup each block before it is updated can be eliminated. In the exemplary embodiment of FIG. 2, a device comprises a memory defining a memory or address space 211 comprising four memory blocks 201-204, each of which holds one software block 1-4, respectively. At the state illustrated in column 206 no blocks have been updated yet, and the software is present in a first version. As for the state of the art method described above, memory space 211 comprises at least one block more than the four blocks 201-204. However, instead of using a specific backup block, an extra block before the binary image represented by blocks 201-204 is used for moving the whole image of the software one block back, or forward, in the address space 211. In alternative embodiments, more than one, e.g. two extra blocks may be used.

When the software is to be updated, the device holding a physical memory to which address space 211 relates, receives a delta or difference file including all information needed for updating the software from the first version to a second version. In the step from state 206 to 207, extra block 212 is erased. Software block 1 is then updated according to a delta file associated with the present software. By using this strategy there is no need to backup each block because the updated block is always written right before the old block. The old block is not overwritten until the write of the updated block is done. Instead of two erase/write operations only one erase/write operation is needed.

The suggested solution has clear benefits, but also brings about a problem to overcome. When there has been one update there no longer exist one extra block in the beginning of the image, since the entire image has been shifted in the address space. However, a preferred embodiment of the present invention provides a solution to this problem. After a first update operation there will be one extra block at the end of the image instead, block 204 in the embodiment of FIG. 2. However, by reversing the update process, i.e. by writing the blocks in backwards order, at the next update the same algorithm can be employed. Another problem is that the actual binary code is linked for a certain base address. If the base address is moved the code would not run, since absolute addresses to locations within the binary image will point at the wrong address. In one way or another, the absolute addresses used in the image must be moved one block after update. According to one embodiment, this problem is solved by generating two delta files for each update, as schematically illustrated in FIG. 3.

Figure 3:
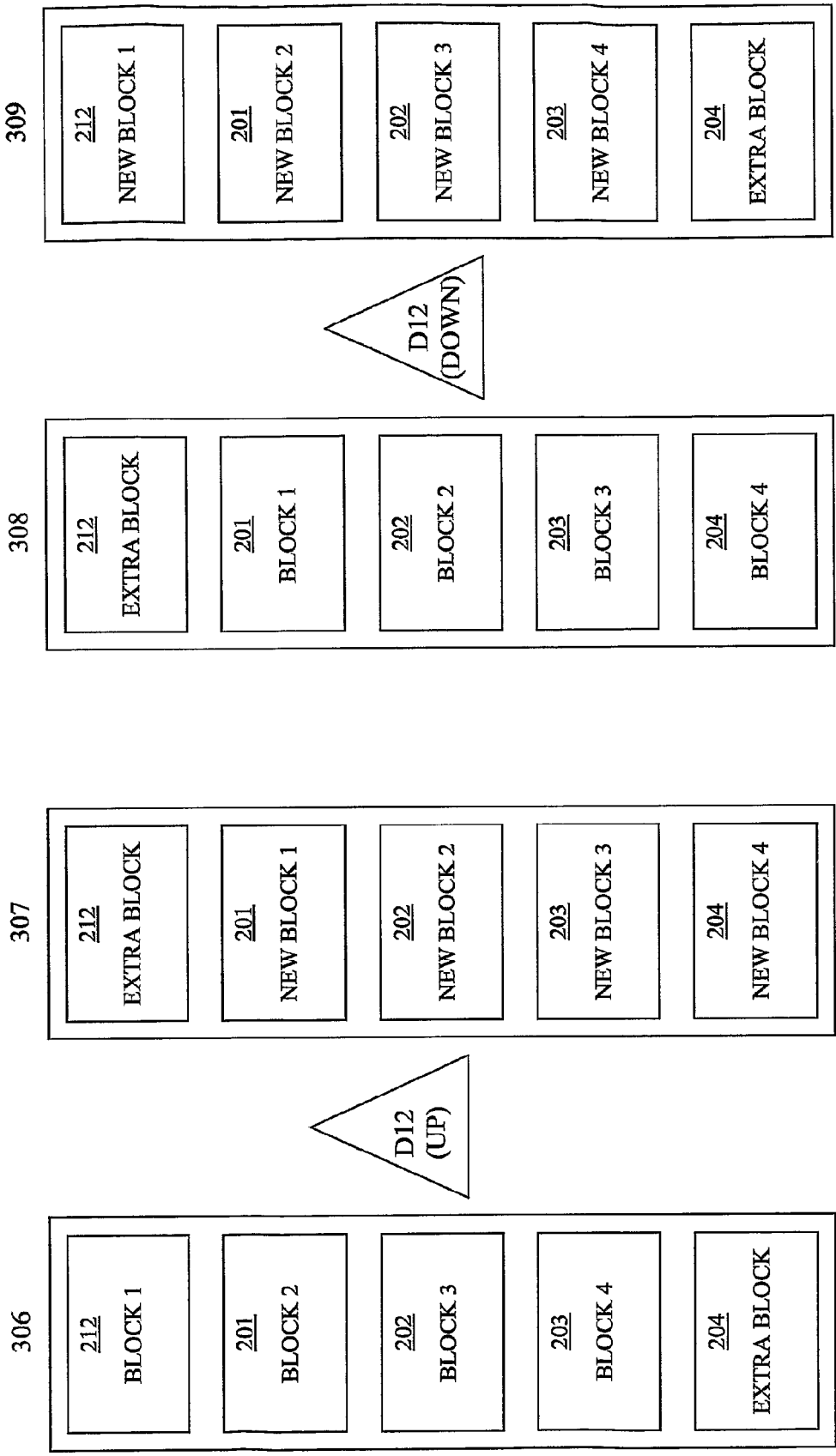
FIG. 3 schematically illustrates two different versions of the overall process of FIG. 2.

In FIG. 3, D12 (UP) represents a first delta file for transforming from software version V1 type A, as illustrated in column 306, to V2 type B as illustrated in column 307. The type A image is consequently the defined address space with the extra block located after blocks 1-4, whereas the type B image is the defined address space with the extra block located before blocks 1-4. D12 (DOWN) represents a second delta file for transforming from software version V1 type B, as illustrated in column 308, to V2 type A as illustrated in column 309. Preferably, the two delta files are generated by modifying the link process to produce type A and B images before generating the actual delta files. Finally the start address, located in the boot code, needs to be modified to point at the correct start address such that execution of the software will proceed as intended. This may be done as a last step of the update procedure.

The update time is in best case halved with the new backup strategy provided by the present invention. This is when all blocks are updated. With the proposed solution all blocks need to be rewritten once. With the current solution only changed blocks need to be updated but they need to be written twice. For updates with more than half of the blocks changed the new solution is faster. Typically most blocks need to be changed during an update.

Figure 4:
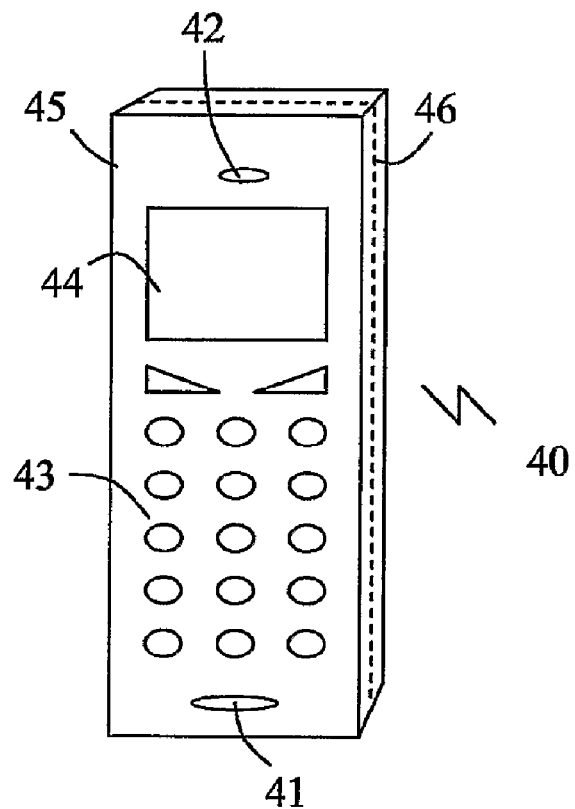
FIG. 4 schematically illustrates an exemplary radio communication terminal implementing a computer program product for executing the process steps of the present invention.
Figure 5:
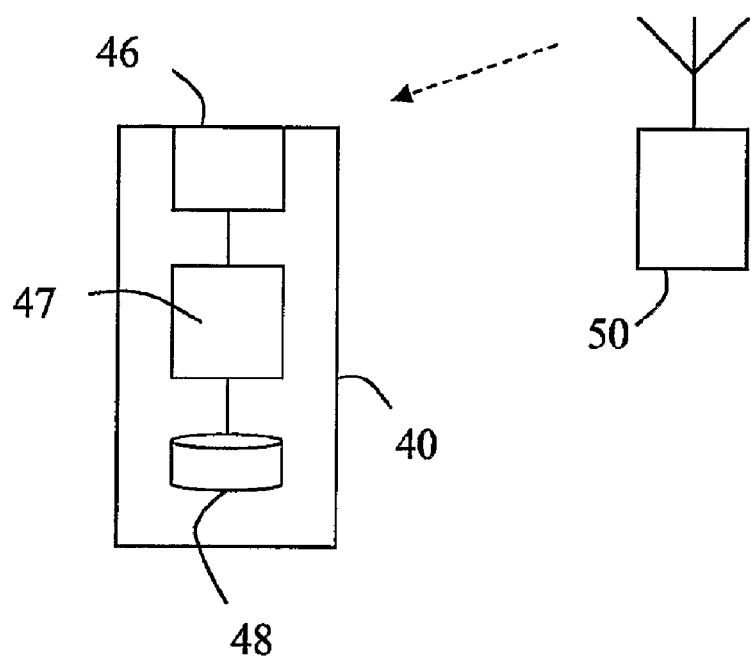
FIG. 5 schematically illustrates the terminal of FIG. 4 with its built-in computer system, during communication with a base station for receiving update delta files for target upgrade in the terminal.

In a preferred embodiment, the present invention used for firmware upgrade over the air, and particularly applied to the field mobile radio communication with radio communication terminals as the target device. FIG. 4 illustrates, as an example for a device in which the present invention may be employed, a radio communication terminal in the embodiment of a cellular mobile phone 40. The terminal 40 comprises a chassis or housing 45, carrying a user audio input in the form of a microphone 41 and a user audio output in the form of a loudspeaker 42 or a connector to an ear piece (not shown). A set of keys, buttons or the like constitutes a data input interface 43 is usable e.g. for dialing, according to the established art. A data output interface comprising a display 44 is further included, devised to display communication information, address list etc in a manner well known to the skilled person. The radio communication terminal 40 includes radio transmission and reception electronics (not shown), and is devised with a built-in antenna 46 inside the housing 45, which antenna is indicated in the drawing by the dashed line as an essentially flat object. FIG. 5 illustrates terminal 40 of FIG. 4 in a simplified way. Terminal 40 is communicatively connectable, by means of its antenna 46, to a base station 50 included in a radio communications network, in a well known manner. Terminal 40 further includes a computer system comprising a microprocessor controller 47 with an associated physical memory 48. By communication with base station 50, terminal 40 is capable of receiving delta files for upgrading software present in memory 48, particularly software binaries, according to the invention. Furthermore, the computer system including processor 47 is devised to store and access software stored in memory 48, using an address space as defined in FIGS. 2 and 3, and to execute the process steps defined in association with FIGS. 2 and 3 above. In particular, the computer system controlled by processor 47 comprises means for erasing and writing on memory blocks as determined by the content of delta files, for updating said software, thereby shifting the content of the memory blocks, updated or not, one block step in the address space.

Figure 6:
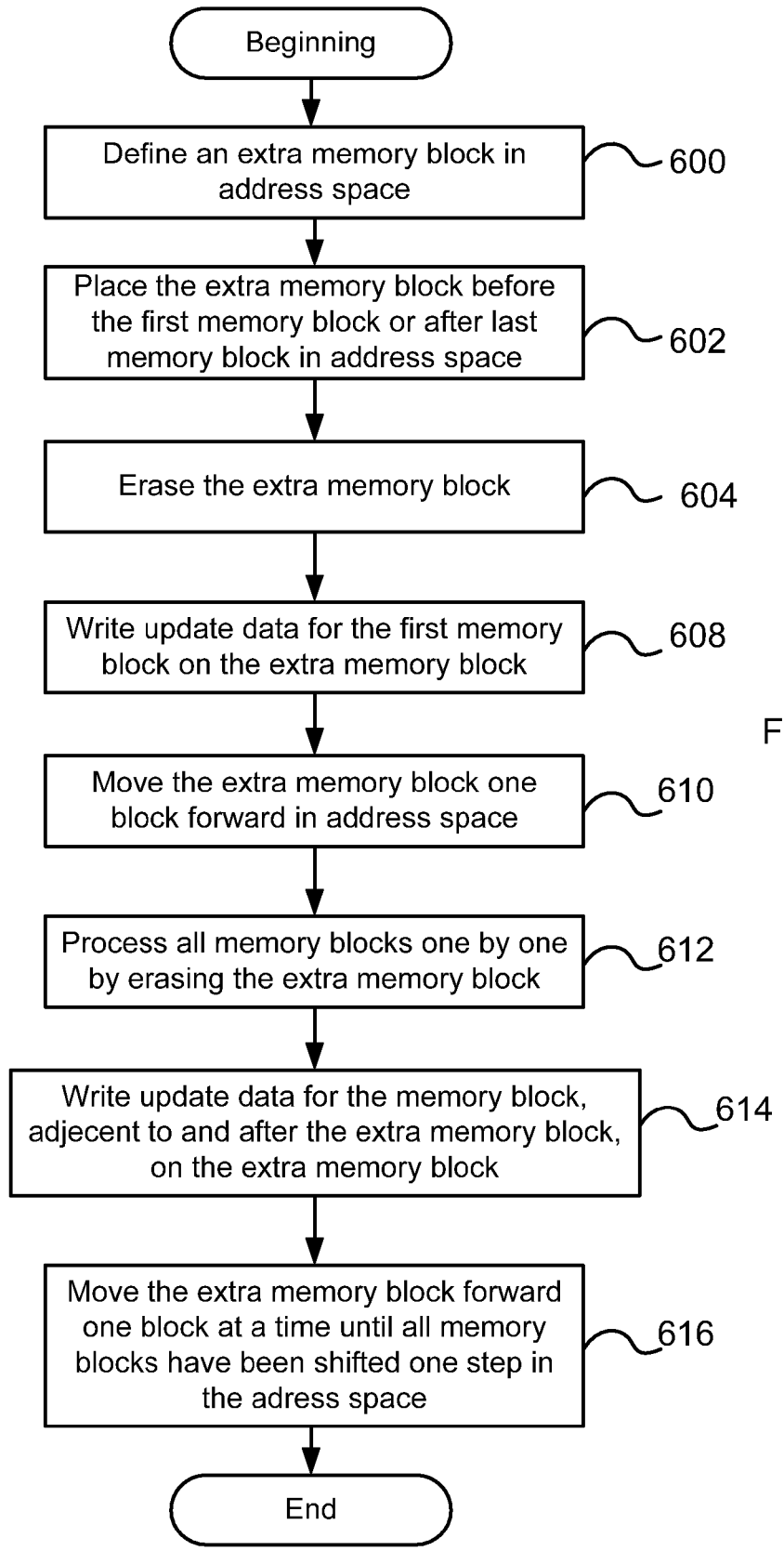
FIG. 6 shows a flowchart describing an update process according to an embodiment of the present invention.

FIG. 6 illustrates an embodiment of the present invention wherein a computer program product, for use in a computer-controlled electronic device for updating software present in a first version in the device, which device includes means for receiving and executing a delta file for upgrading said first version to a second version, which software is divided and stored in a number of memory blocks defined in an address space of a physical memory in the device, said computer program product including executable computer program code devised to cause the device to perform the steps of, defining an extra memory block 600 associated with said number of memory blocks, initially being placed before a first memory block located at one end of the memory space 602, erasing said extra memory block 604, writing updated data for the first memory block on said extra memory block 608, moving the extra memory block one block forward 610, and processing all of said number of memory blocks one by one by erasing said extra memory block 612, writing updated data for the memory block adjacent to and after the extra memory block on the extra memory block 614, moving said extra memory block forward one block at a time until all of said number of memory blocks have been shifted one step in the address space 616.

The foregoing has described the principals, preferred embodiments and modes of operation of the present invention. It should be appreciated, though, that variations may be made in those embodiments by those skilled in the arts without departing from the scope of the present invention as defined in the appended claims.

The invention claimed is:

1. Method for updating software present in a first version in a device, by receiving and executing a delta file for upgrading said first version to a second version, which software is divided and stored in a number of memory blocks defined in an address space of a physical memory in the device, comprising the steps of:
defining an extra memory block associated with said number of memory blocks, initially being placed before a first memory block located at one end of the memory space;
erasing said extra memory block;
writing updated data for the first memory block on said extra memory block;
moving the extra memory block one block forward; and
processing all of said number of memory blocks one by one by
erasing said extra memory block,
writing updated data for the memory block adjacent to and after the extra memory block on the extra memory block,
moving said extra memory block forward one block at a time, until all of said number of memory blocks have been shifted one step in the address space;
reversing the order of writing memory blocks in the address space, from said upgrade from a first version to a second version, to a second upgrade from said second version to a third version;
said device, before receiving and executing a delta file, connecting with a server and communicating information related to a current address space status determining which type of delta file is applicable for upgrading said software, dependent on the present location of said extra block in said address space, wherein a first delta file type is adapted to upgrade the software present in said memory blocks in one order in the address space, and a second delta file adapted to upgrade the software present in said memory blocks in a reversed order in the address space;
downloading a delta file of the applicable delta file type from said server to said device; and
upgrading said software using the applicable delta file.

2. The method as recited in claim 1, comprising the step of modifying a start address within said address space in a boot code for said software, dependent on the moving of data between said memory blocks.

3. Computer program product, for use in a computer-controlled electronic device for updating software present in a first version in the device, which device comprises means for receiving and executing a delta file for upgrading said first version to a second version, which software is divided and stored in a number of memory blocks defined in an address space of a physical memory in the device, said computer program product comprising executable computer program code devised to cause the device to perform the steps of:
defining an extra memory block associated with said number of memory blocks, initially being placed before a first memory block located at one end of the memory space;
erasing said extra memory block;
writing updated data for the first memory block on said extra memory block;
moving the extra memory block one block forward; and
processing all of said number of memory blocks one by one by erasing said extra memory block,
writing updated data for the memory block adjacent to and after the extra memory block on the extra memory block,
moving said extra memory block forward one block at a time, until all of said number of memory blocks have been shifted one step in the address spaces;
reversing the order of writing memory blocks in the address space, from said upgrade from a first version to a second version, to a second upgrade from said second version to a third version;
said device, before receiving and executing a delta file, connecting with a server and communicating information related to a current address space status determining which type of delta file is applicable for upgrading said software, dependent on the present location of said extra block in said address space, wherein a first delta file type is adapted to upgrade the software present in said memory blocks in one order in the address space, and a second delta file adapted to upgrade the software present in said memory blocks in a reversed order in the address space;

downloading a delta file of the applicable delta file type from said server to said device; and upgrading said software using the applicable delta file.

4. The computer program product as recited in claim 3, comprising executable computer program code devised to cause the device to perform the step of: modifying a start address within said address space in a boot code for said software, dependent on the moving of data between said memory blocks.

5. Radio communication terminal comprising a computer system with associated computer code for updating software present in a first version in the terminal, and means for receiving and executing a delta file for upgrading said first version to a second version, which software is divided and stored in a number of memory blocks defined in an address space of a physical memory in the terminal, characterised in that an extra memory block associated with said number of memory blocks is defined in said address space, initially being placed before a first memory block located at one end of the memory space, said terminal further comprising means for erasing said extra memory block; data writing means for writing updated data for the first memory block on the extra memory block; means for moving the extra memory block one block forward; and means for processing all of said number of memory blocks one by one by erasing said extra memory block, writing updated data for the memory block adjacent to and after the extra memory block on the extra memory block, moving said extra memory block forward one block at a time, until all of said number of memory blocks have been shifted one step in the address space; and means for reversing the order of writing memory blocks in the address space, from said upgrade from a first version to a second version, to a second upgrade from said second version to a third version;

wherein said device is arranged to connect with a server before receiving and executing a delta file, for communicating information related to a current address space status determining which type of delta file is applicable for upgrading said software, dependent on the present location of said extra block in said address space, wherein a first delta file type is adapted to upgrade the software present in said memory blocks in one order in the address space, and a second delta file adapted to upgrade the software present in said memory blocks in a reversed order in the address space, said terminal comprising means for downloading a delta file of the applicable delta file type from said server to said device, and means for upgrading said software using the applicable delta file.

6. The radio communication terminal as recited in claim 5, comprising means for modifying a start address within said address space in a boot code for said software, dependent on the moving of data between said memory blocks during writing as determined by said delta file.

\* \* \* \* \*